(12) United States Patent
Kaneda et al.

(10) Patent No.: US 7,165,014 B2
(45) Date of Patent: Jan. 16, 2007

(54) PARTIAL DISCHARGE MONITORING APPARATUS AND PARTIAL DISCHARGE REMOTE MONITORING SYSTEM FOR ROTATING ELECTRIC MACHINES

(75) Inventors: Yoshiharu Kaneda, Tokyo (JP); Chiharu Kawase, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 122 days.

(21) Appl. No.: 10/918,491

(22) Filed: Aug. 16, 2004

(65) Prior Publication Data

US 2005/0012507 A1 Jan. 20, 2005

(30) Foreign Application Priority Data

Dec. 3, 2003 (JP) ............................. 2003-404334
Apr. 19, 2004 (JP) ............................. 2004-122463

(51) Int. Cl.
*G06F 11/00* (2006.01)
*G01R 31/34* (2006.01)

(52) U.S. Cl. ..................................... 702/188; 324/772
(58) Field of Classification Search ................ 702/188; 324/772
See application file for complete search history.

(56) References Cited

U.S. PATENT DOCUMENTS 5,126,677 A   6/1992   Campbell et al.
5,475,312 A   12/1995  Sedding et al.
5,680,059 A   10/1997  Shiota et al.
6,553,336 B1* 4/2003   Johnson et al. ............. 702/188
2002/0097065 A1* 7/2002  Krahn et al. ................. 324/772

FOREIGN PATENT DOCUMENTS

JP          2002-71742         3/2002

OTHER PUBLICATIONS

Campbell, S.R., et al.; "Practical On-Line Partial Discharge Tests For Turbine Generators and Motors", *IEEE Transactions on Energy Conversion*, vol. 9, No. 2, pp. 281-287, (Jun. 1994).
Stone, Greg C., et al.; "Application of Partial Discharge Testing to Motor and Generator Stator Winding Maintenance", *IEEE Transactions on Industry Appl.*, vol. 32, No. 2, pp. 459-464, (Mar./Apr. 1996).

* cited by examiner

*Primary Examiner*—Marc S. Hoff
*Assistant Examiner*—Janet L Suglo
(74) *Attorney, Agent, or Firm*—Leydig, Voit & Mayer, Ltd.

(57) ABSTRACT

A partial discharge monitoring apparatus for a rotating electric machine includes a partial discharge detecting circuit which measures each signal output from a partial discharge sensor located in the rotating electric machine simultaneously in a first frequency band and a second frequency band. Detection time for detecting each signal includes a peak hold time and a dead time, which comes after the peak hold time. A next-occurring signal is detected after the dead time has elapsed.

13 Claims, 7 Drawing Sheets

TWO-FREQUENCY SIGNAL INTENSITY CORRELATION

DETECTION TIMING CHART

PARTIAL DISCHARGE MONITORING APPARATUS AND PARTIAL DISCHARGE REMOTE MONITORING SYSTEM FOR ROTATING ELECTRIC MACHINES

BACKGROUND OF THE INVENTION

1. Field of the Invention

The present invention relates to a partial discharge monitoring apparatus and a partial discharge remote monitoring system for monitoring partial discharges occurring in rotating electric machines.

2. Description of the Background Art

Partial discharge monitoring apparatuses for detecting and monitoring partial discharges occurring in rotating electric machines, such as turbine generators, are conventionally known.

One example of such a partial discharge monitoring apparatus is disclosed in Japanese Laid-open Patent Publication No. 2002-71742, in which partial discharges are measured by a single-channel detecting circuit which limits a detecting range by using a narrowband filter to remove noise components existing outside the passband of the narrowband filter.

Another example of a partial discharge monitoring apparatus is proposed in Japanese Patent Publication No. 3187642. The partial discharge monitoring apparatus of this Patent Publication employs a first narrowband filter and a second narrowband filter to discriminate between partial discharges and noise components.

Still another example of a partial discharge monitoring apparatus is shown in Japanese Patent Publication No. 2751834. The partial discharge monitoring apparatus of this Patent Publication judges anomalies of a high-voltage device by comparing bandwidths of two specific frequencies.

However, the apparatus shown in Japanese Laid-open Patent Publication No. 2002-71742 has a problem that the apparatus can not remove noise components falling within the passband of the narrowband filter.

Japanese Patent Publication No. 3187642 makes no mention of the remote monitoring capability of the apparatus disclosed therein. As a result of the recent shift to liberalization of power supply, there is a growing need to perform centralized supervisory control of many turbine generators installed at thermal power plants, for example, which are distributed at different local sites. Despite this current trend, Japanese Patent Publication No. 3187642 gives no mention of the remote monitoring capability of the apparatus. In addition, this Patent Publication includes no mention of time resolution needed for collecting signals by using two frequency bands for the purpose of comparison. Typically, several hundred to several thousand partial discharges to be measured occur in a rotating electric machine. A shortcoming of the apparatus of Japanese Patent Publication No. 3187642 is that the apparatus becomes too large and too expensive if this apparatus is to be used for detecting such a large number of partial discharges with high resolution and for transferring data for the purpose of remote monitoring operation.

Further, the apparatus shown in Japanese Patent Publication No. 2751834 has a wide detecting frequency band, so that this apparatus has a problem that it can not remove noise components falling within this frequency band. The approach of this Patent Publication has a shortcoming that the apparatus becomes too large and too expensive.

The apparatuses of Japanese Laid-open Patent Publication No. 2002-71742 and Japanese Patent Publication Nos. 3187642 and 2751834 have some common problems which are explained below.

When a rotating electric machine is in operation, high-frequency noise is generated by the rotating electric machine itself and surrounding devices, and pulses of the high-frequency noise are detected by a partial discharge sensor. According to a two-frequency correlation method in which pulses occurring at random in time are detected by using two frequency bands f1 and f2, high time resolution is needed for measuring the same pulses by using the two frequency bands f1 and f2. To achieve this, each pulse must be detected within a period of 1 μs to 2 μs.

Generally, noise pulses occur in extraordinarily large numbers. If the noise pulses are continuously measured with a time resolution of 2 μs, a maximum of 500,000 pulses will be detected per second by each of detecting circuits having the frequency bands f1 and f2. This results in a total of 1,000,000 pieces of data per second, which would require an enormous memory capacity. In a case where partial discharges occur intermittently, a measurement time of 1 second is insufficient. In this case, a measurement time of about 10 seconds is needed. If pulses are measured with a time resolution of 2 μs, a maximum of 10,000,000 pieces of data will be produced during the 10-second measurement time. This large quantity of data necessitates not only an enormous memory capacity but a long processing time. Again, the apparatus having a capability to handle this quantity of data becomes too large and too expensive.

Another problem is that an extraordinarily long time will be needed for data transfer to enable the remote monitoring operation. To solve this problem, it will be necessary to substantially reduce the number of detected pulses while maintaining the pulse discriminating capability.

One approach to reducing the number of detected pulses would be to set a long peak hold time ranging from 10 μs to 100 μs and to detect a maximum value occurring during this peak hold time. In this approach, however, the detecting circuits having the frequency bands f1 and f2 would detect pulses having different pulse signal intensities, so that two-frequency correlation characteristics are not obtained.

SUMMARY OF THE INVENTION

The present invention is intended to solve the aforementioned problems of the prior art. It is an object of the invention to provide a compact partial discharge monitoring apparatus having an excellent noise-removing capability. It is a more specific object of the invention to provide a compact partial discharge monitoring apparatus which can detect pulses with high resolution and reduce the number of detected pulses, wherein each pulse is detected by using two frequency bands, only very high frequency components of partial discharge signals are detected with high resolution according to a phenomenon of the occurrence of partial discharges in a rotating electric machine, and a partial discharge detection repetition interval is increased in consideration of partial discharge recurring intervals. It is a further object of the invention to provide a partial discharge remote monitoring system employing such a partial discharge monitoring apparatus.

According to the invention, a partial discharge monitoring apparatus for a rotating electric machine includes a partial discharge detecting circuit which measures each signal output from a partial discharge sensor located in the rotating electric machine simultaneously in a first frequency band f1 and a second frequency band f2. The first frequency band f1, of which bandwidth is set between 1 MHz and 3 MHz, is set within a range of 5 MHz to 40 MHz, and the second frequency band f2 is set to a frequency band at least 5 MHz higher than the first frequency band f1. A detection time for detecting each signal includes a peak hold time starting from a point of detection of a signal in the first frequency band f1 and ending at a point of detection of a peak value of the signal and a specific dead time which comes after the peak hold time. A signal occurring next is detected after the dead time has elapsed.

In this partial discharge monitoring apparatus of the invention, the detection time for detecting a partial discharge pulse signal is the time starting from the point of detection of the signal in the first frequency band f1 and ending at the point of detection of the peak value of the signal, and the specific dead time is provided following the detection time. This arrangement makes it possible to discriminate between partial discharges and noise pulses while substantially reducing the number of detected pulses. In addition, this arrangement makes it possible to reduce the size and cost of the partial discharge monitoring apparatus.

According to the invention, a partial discharge remote monitoring system for a rotating electric machine includes a partial discharge sensor located in the rotating electric machine, a partial discharge monitoring apparatus, and a supervisory control center connected to the partial discharge monitoring apparatus via a communications network. The partial discharge monitoring apparatus of this partial discharge remote monitoring system includes a partial discharge detecting circuit and a controller CPU, the partial discharge detecting circuit including first and second frequency band detecting circuits which include first and second attenuators, first and second bandpass filters and first and second peak hold circuits, respectively. The first and second frequency band detecting circuits simultaneously measure each signal output from the partial discharge sensor located in the rotating electric machine, while the controller CPU controls measurement ranges of the first and second frequency band detecting circuits by controlling the first and second attenuators. The first and second bandpass filters allow signals which have passed through the first and second attenuators to pass through if the signals fall within predetermined first and second frequency bands, respectively, the second frequency band of the second bandpass filter being higher than the first frequency band of the first bandpass filter. The first and second peak hold circuits operate and detect a peak value of an input signal when the input signal among the signals which have passed through the first and second bandpass filters exceeds a signal detection level, in which the second peak hold circuit is caused to operate only when the first peak hold circuit has operated. A detection time for detecting the signal input into each of the first and second peak hold circuits includes a peak hold time, a reset time and a dead time, and a signal occurring next is detected after the dead time has elapsed. In this partial discharge remote monitoring system, a comparator provided in the partial discharge monitoring apparatus compares data on the detected signal with a preset reference value and immediately transmits the signal data to the supervisory control center if a partial discharge which has occurred in the rotating electric machine exceeds a predefined permissible level.

In this partial discharge remote monitoring system of the invention, the number of detected pulses is substantially reduced and, when the partial discharge which has occurred in the rotating electric machine exceeds the predefined permissible level, data on the detected partial discharge signal is immediately transmitted to the supervisory control center. This arrangement makes it possible to promptly take remedial action as necessary, thereby enabling unmanned remote monitoring operation.

These and other objects, features and advantages of the invention will become more apparent upon reading the following detailed description along with the accompanying drawings.

DESCRIPTION OF THE PREFERRED EMBODIMENTS

The invention is now described in detail with reference to the accompanying drawings.

First Embodiment

Figure 1:
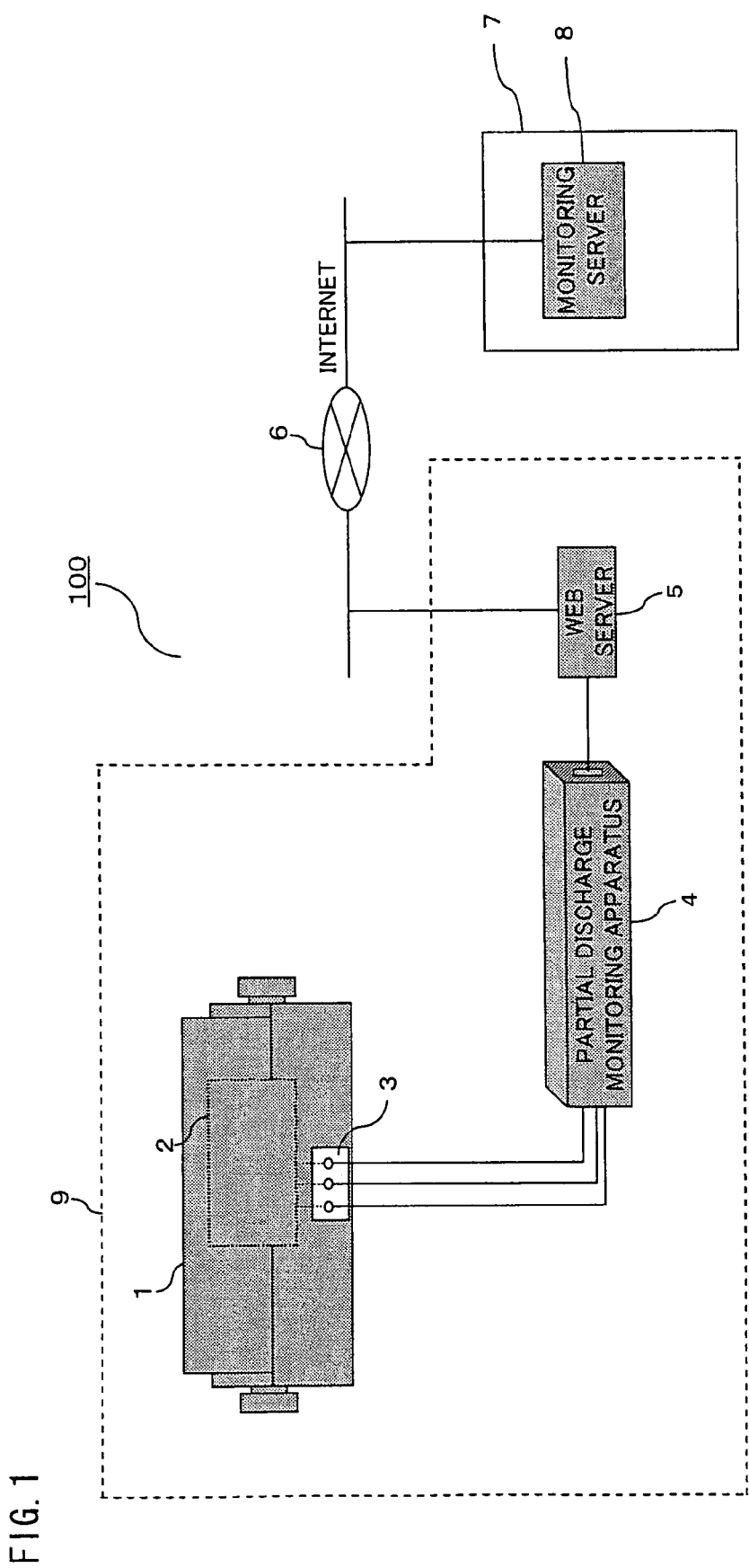
FIG. 1 is a diagram showing the configuration of a partial discharge remote monitoring system for explaining a partial discharge monitoring apparatus according to a first embodiment of the invention.

FIG. 1 is a diagram showing the configuration of a partial discharge remote monitoring system 100 for explaining a partial discharge monitoring apparatus 4 according to a first embodiment of the invention. The partial discharge remote monitoring system 100 is, for example, a system for remotely monitoring the state of insulation of a rotating electric machine 1, such as a turbine generator, installed in a thermal power plant 9. In this system, signals output from partial discharge sensors 2 which are located in the rotating electric machine 1 are led to the exterior of the generator through a terminal box 3 and input into the partial discharge monitoring apparatus 4. The partial discharge monitoring apparatus 4 transmits and receives information to and from a monitoring server 8 located at a supervisory control center 7 which performs centralized supervisory control of various devices installed in multiple power plants, for example, via a web server 5 and the Internet 6.

Figure 2:
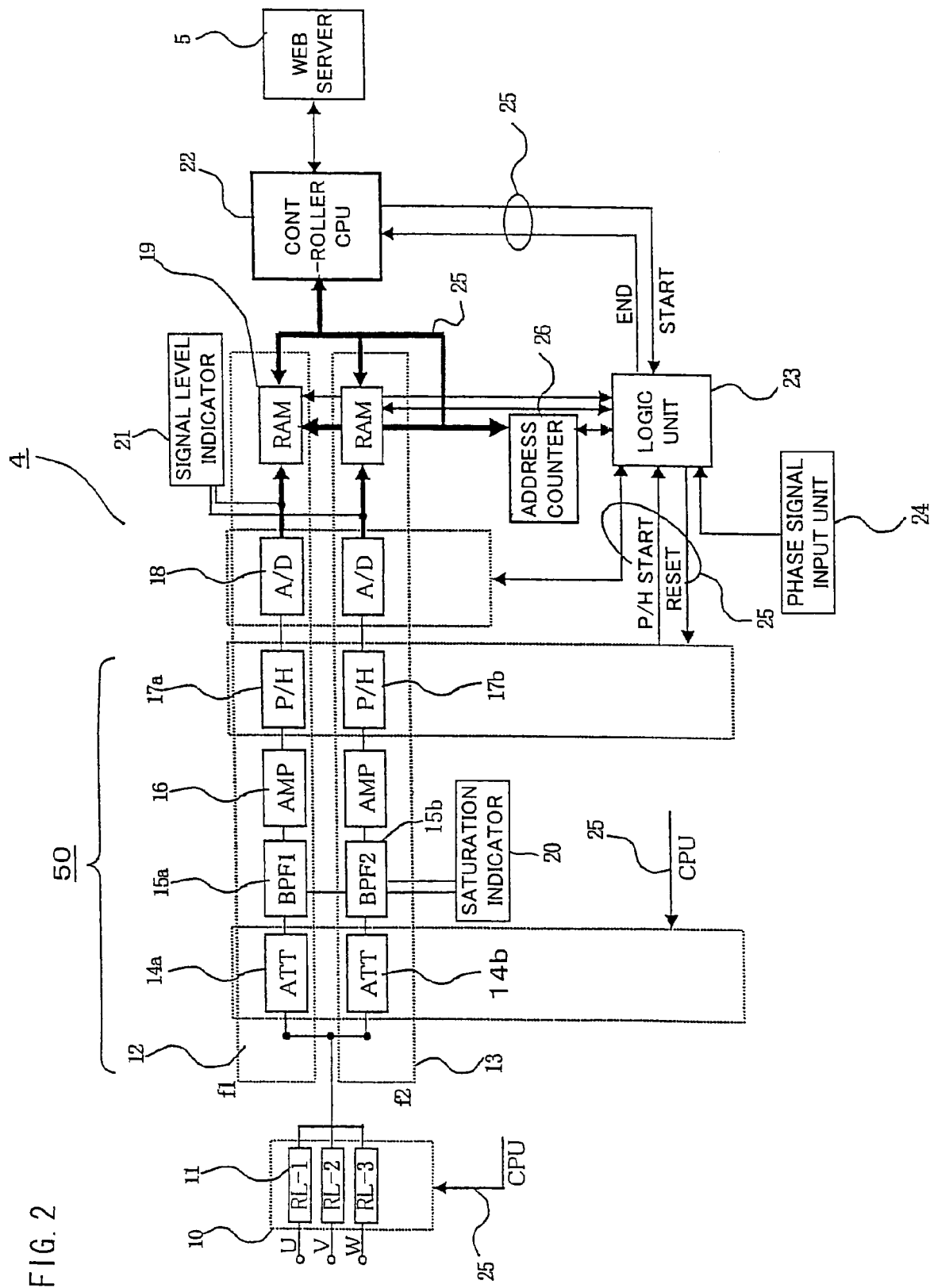
FIG. 2 is a block diagram showing the configuration of the partial discharge monitoring apparatus of the first embodiment.

FIG. 2 is a block diagram showing the configuration of the partial discharge monitoring apparatus 4. The partial discharge monitoring apparatus 4 is configured as follows. The partial discharge monitoring apparatus 4 selects one of the partial discharge sensors 2 provided individually in U-, V- and W-phases as switched by relays 11 of a selector 10. The signal output from the selected partial discharge sensor 2 is input into an f1 band detecting circuit 12 which serves as a first frequency band detecting circuit and into an f2 band detecting circuit 13 which serves as a second frequency band detecting circuit. The f1 band detecting circuit 12 includes an attenuator 14a, an f1 bandpass filter 15a, an amplifier 16, a peak hold circuit 17a, an analog-to-digital (A/D) converter 18, a random-access memory (RAM) 19, a saturation indicator 20 and a signal level indicator 21. The f2 band detecting circuit 13 includes an attenuator 14b, an f2 bandpass filter 15b, an amplifier 16, a peak hold circuit 17b, an A/D converter 18, a random-access memory (RAM) 19, the saturation indicator 20 and the signal level indicator 21. While the f2 band detecting circuit 13 has basically the same circuit configuration as the f1 band detecting circuit 12, the detecting frequency band of the f2 bandpass filter 15b of the f2 band detecting circuit 13 differs from that of the f1 bandpass filter 15a of the f1 band detecting circuit 12. The partial discharge monitoring apparatus 4 further includes a controller central processing unit (CPU) 22, a logic unit 23 and a phase signal input unit 24.

Now, operation of the partial discharge monitoring apparatus 4 is explained.

The partial discharge monitoring apparatus 4 selects specific one of the partial discharge sensors 2 by operating the relays 11 of the selector 10 according to a sequence programmed in the controller CPU 22. The partial discharge sensors 2 are disposed individually at stator coils of the U-, V- and W-phases. By selecting one of the partial discharge sensors 2 in this way, the partial discharge monitoring apparatus 4 selects the stator coil of a phase to be monitored.

The signal output from the selected partial discharge sensor 2 is branched into two channels to discriminate between a partial discharge and noise. One of branched signals is input into the f1 band detecting circuit 12 while the other is input into the f2 band detecting circuit 13. Signal flows in the partial discharge monitoring apparatus 4 and operational steps executed thereby are now explained below.

Step 1: The partial discharge monitoring apparatus 4 automatically selects measurement ranges according to signal levels.

The partial discharge monitoring apparatus 4 automatically selects the measurement ranges by controlling the attenuators 14a, 14b with the aid of the controller CPU 22. The measurement ranges are selected individually for the f1 band detecting circuit 12 and the f2 band detecting circuit 13.

Step 2: The partial discharge monitoring apparatus 4 measures pulses.

The signals which have passed through the attenuators 14a, 14b are entered into the f1 bandpass filter 15a and the f2 bandpass filter 15b which allow signal components falling within respective frequency bands predetermined within a range of 5 MHz to 40 MHz to pass through. The f2 bandpass filter 15b is set to an arbitrarily selected frequency band which is higher than the frequency band of the f1 bandpass filter 15a by 5 MHz or more but not exceeding 40 MHz. The f1 bandpass filter 15a and the f2 bandpass filter 15b both have a bandwidth of 3 MHz. When saturated signals are input into the f1 bandpass filter 15a and the f2 bandpass filter 15b, the saturation indicator 20 indicates this situation. This feature is used to prevent such a malfunction that the signals are erroneously taken as seemingly unsaturated due to frequency characteristics of the saturated signals.

After the signals which have passed through the f1 bandpass filter 15a and the f2 bandpass filter 15b are amplified by a fixed amplification factor by the amplifiers 16, the peak hold circuits 17a, 17b detect peak values of the signals. Then, the A/D converters 18 convert the peak values into digital values, which are stored in the memories 19.

Step 3: The partial discharge monitoring apparatus 4 discriminates between a partial discharge and noise.

Now, an idea used in and an operation performed for discriminating between a partial discharge and noise by detecting signal components thereof by the aforementioned two frequency bands are explained.

When insulation of the stator coil deteriorates, partial discharges occur due to an operating voltage. This phenomenon of the occurrence of partial discharges is characterized by the following features.

1. An extremely large number of partial discharge pulses occur. Generally, several hundred to several thousand partial discharge pulses occur per second.

2. There are cases where high-level partial discharges which are regarded contributable to deterioration of insulation occur intermittently.

3. If the partial discharge sensor 2 is located in the proximity of the stator coil, attenuation of high-frequency components of the partial discharge is small since the partial discharge occurs close to the partial discharge sensor 2. In contrast, attenuation of high-frequency components of noise is large and a detected signal intensity is low due to signal propagation since the noise usually occurs at a point far from the partial discharge sensor 2.

Figure 3:
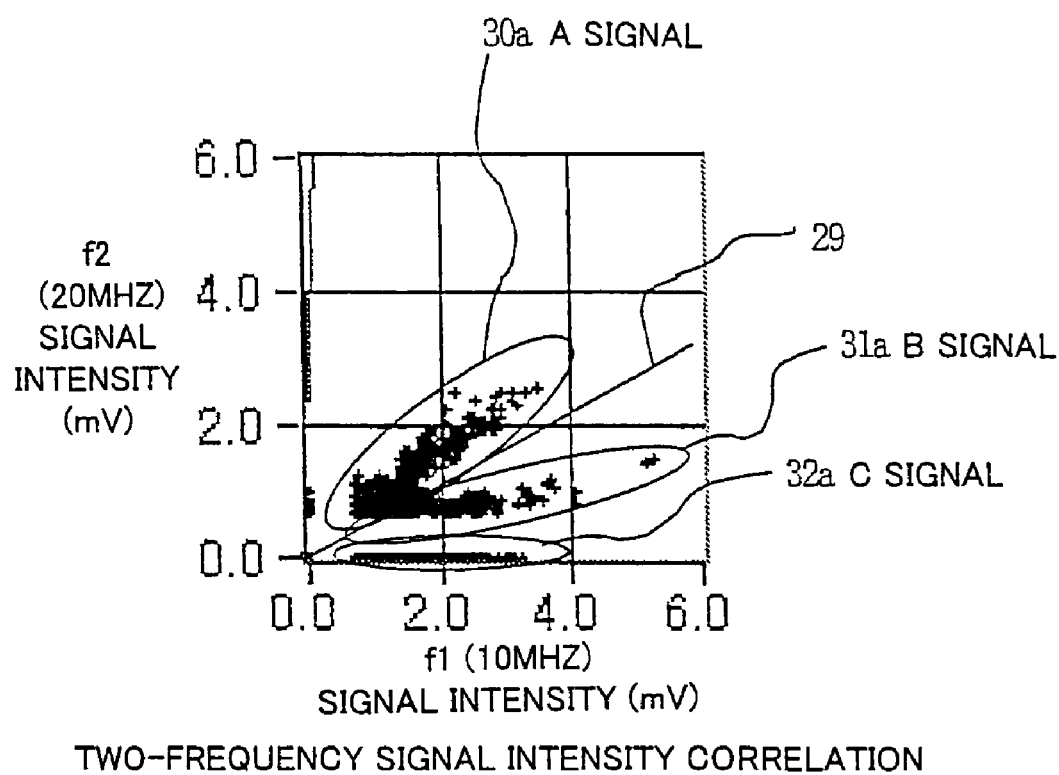
FIG. 3 is a diagram showing how a partial discharge and noise are discriminated from each other according to the first embodiment.

The following discussion illustrates how the partial discharge and noise are discriminated from each other by a two-frequency correlation approach according to the first embodiment with reference to FIG. 3. FIG. 3 is a diagram showing a two-frequency signal intensity correlation which is a relationship between intensities of signals detected for a period of 1 second by the f1 band detecting circuit 12 (f1=10 MHz) and intensities of signals detected for the same period by the f2 band detecting circuit 13 (f2=20 MHz). This diagram (FIG. 3) is obtained at both the partial discharge monitoring apparatus 4 and the supervisory control center 7. In the example shown in FIG. 3, the detected signals can be divided into three groups. These are an A signal group 30a including signals of which intensities detected by the f2 band detecting circuit 13 (f2=20 MHz) divided by intensities detected by the f1 band detecting circuit 12 (f1=10 MHz) is approximately 0.8, a B signal group 31a including signals of which intensities detected by the f2 band detecting circuit 13 (f=20 MHz) divided by intensities detected by the f1 band detecting circuit 12 (f=10 MHz) is approximately 0.25, and a C signal group 32a including signals which are detected only in the frequency band f1. The total number of pulses detected and measured during the 1-second period is approximately 2,000.

Figure 4:
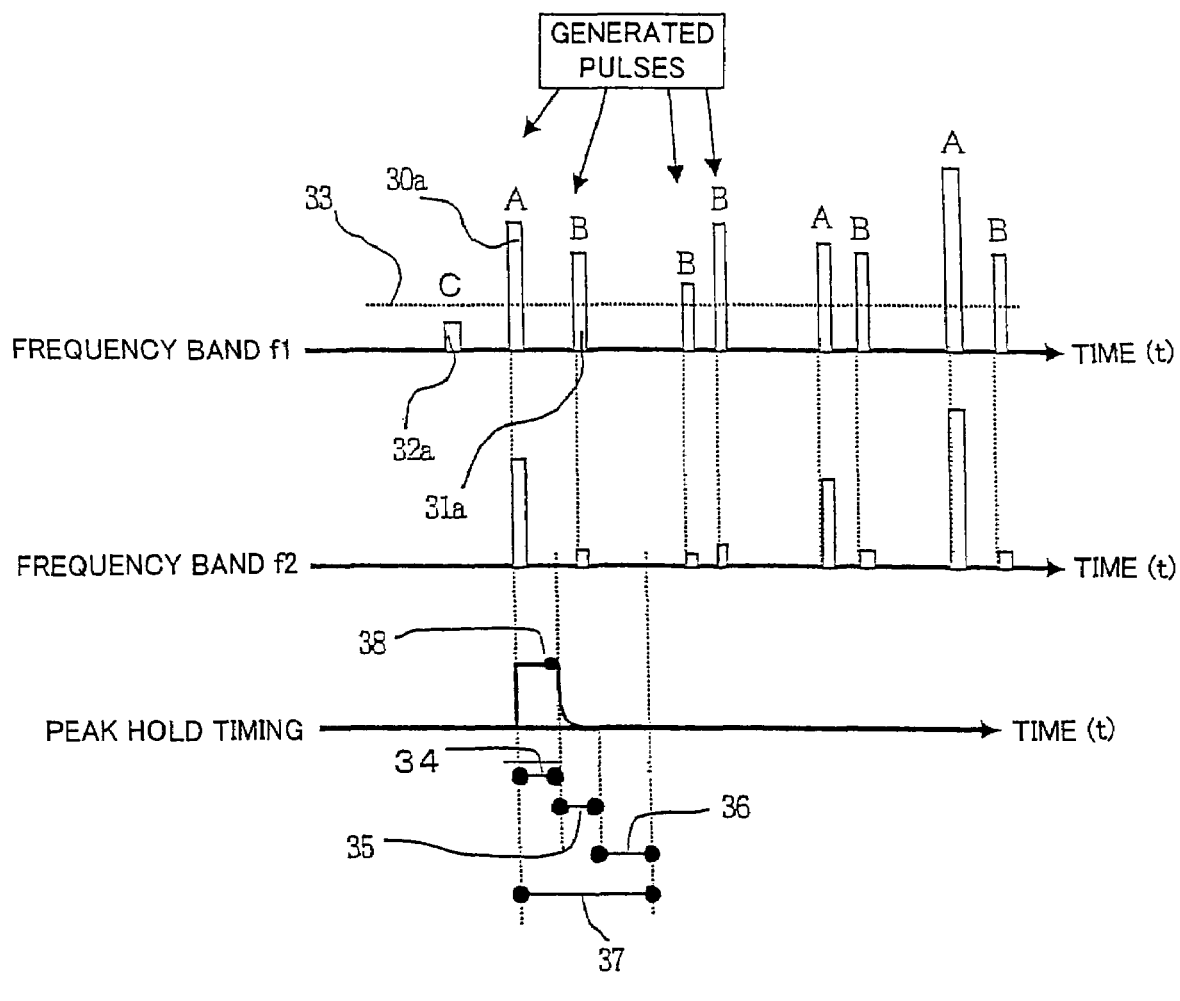
FIG. 4 is a diagram showing pulse signal detection timing and signal intensities detected by the partial discharge monitoring apparatus of the first embodiment.

FIG. 4 shows detection timing for obtaining the two-frequency correlation shown in FIG. 3. Specifically, illustrated in FIG. 4 is an example of detection timing and signal intensities obtained when successive pulses are simultaneously detected by the f1 band detecting circuit 12 and the f2 band detecting circuit 13. The heights of vertical bars in FIG. 4 represent the intensities of the individual pulses and the letters A and B marked at the top of the vertical bars designate A signals and B signals shown in FIG. 3. The detection timing and data measurement are controlled by the controller CPU 22, the logic unit 23 and a data bus 25.

Individual partial discharge signals and noise pulses detected by the partial discharge sensors 2 are input into the peak hold circuits 17a, 17b. The peak hold circuits 17a, 17b operate when a signal exceeding a signal detection level 33 is input. Operating time of each of the peak hold circuits 17a, 17b includes a peak hold time 34, a reset time 35 and a dead time 36. The peak hold time 34 lasts for 2 µs after a signal is input. Then, values held in the peak hold circuits 17a, 17b are reset during the reset time 35 which lasts for 2 µs and is followed by the dead time 36 which lasts for 6 µs in this example. A total detection time detecting for a single pulse is therefore 10 µs. The partial discharge monitoring apparatus 4 is constructed in such a manner that the peak hold circuit 17b of the f2 band detecting circuit 13 operates only when the peak hold circuit 17a of the f1 band detecting circuit 12 has operated with the input signal exceeding the signal detection level 33. When a particular pulse signal has been peak-held, peak values and times of detection of the pulse in the individual frequency bands f1, f2 are stored in the memories 19. FIG. 3 is an illustration of pulses which were detected and stored in the aforementioned manner and read out form the memories 19.

The dead time 36 is made variable within a range of 6 µs to 100 µs. It is possible to limit the number of detected pulses by varying the dead time 36 as the partial discharge monitoring apparatus 4 does not detect any pulses during the dead time 36. One potential problem of this arrangement of the embodiment is that pulses of partial discharges occurring during the dead time 36 might produce a harmful effect by contributing to deterioration of insulation. It should however be understood from the following discussion that this problem could be avoided in the present invention.

Generally, deterioration of insulation occurring in a rotating electric machine is related to the magnitude of each partial discharge. The more the inside of an insulator deteriorates, the larger the partial discharge becomes and the lower the dielectric breakdown voltage becomes. Therefore, remote monitoring of the state of insulation includes monitoring of changes in the magnitude of partial discharges. The Institute of Electrical Engineers of Japan recommends that maximum discharge quantity Qmax be used as the magnitude of a partial discharge for the purpose of assessing insulation performance. The maximum discharge quantity is defined as a level at which a single partial discharge occurs in a stable fashion in each cycle of voltage application. In a region where the commercial frequency is 60 Hz, the maximum discharge quantity is a level at which 60 pulses occur per second (60 pps) due to partial discharges. This level of 60 pps corresponds to a pulse recurring interval of a little longer than 10 ms. Several hundred to about 2,000 pulses are needed to obtain a partial discharge occurring phase characteristic which is used as an index used in assessing the degree of deterioration of insulation. If 10,000 pulses are detected within 10 seconds, an average pulse recurring interval is 1 ms. In actual situations, the pulse recurring interval is shorter than this, because the pulses occur at random with phases at which the differential dv/dt has a large value. Thus, the pulse recurring interval is expected to be 100 µs or so even under conditions in which the pulses occur frequently.

Even if the partial discharge monitoring apparatus 4 fails to detect some of partial discharges during the dead time 36, the phase characteristic is sufficiently obtained if 2,000 detected pulses are available. Therefore, a small number of detection errors do not cause any serious problem.

It is obvious from the foregoing discussion that the provision of the dead time 36 ranging from 6 µs to 100 µs does not produce any disadvantage.

Reasons why the peak hold time 34 is set to 2 µs are as follows.

Figure 5:
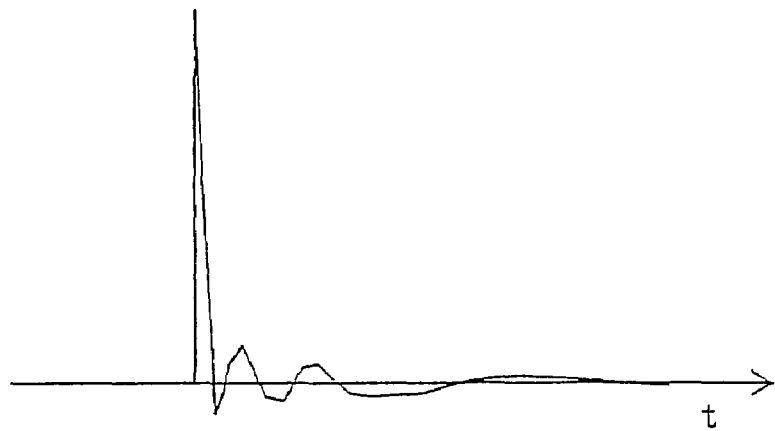
FIG. 5 is a diagram showing the waveform a typical partial discharge signal.
Figure 6:
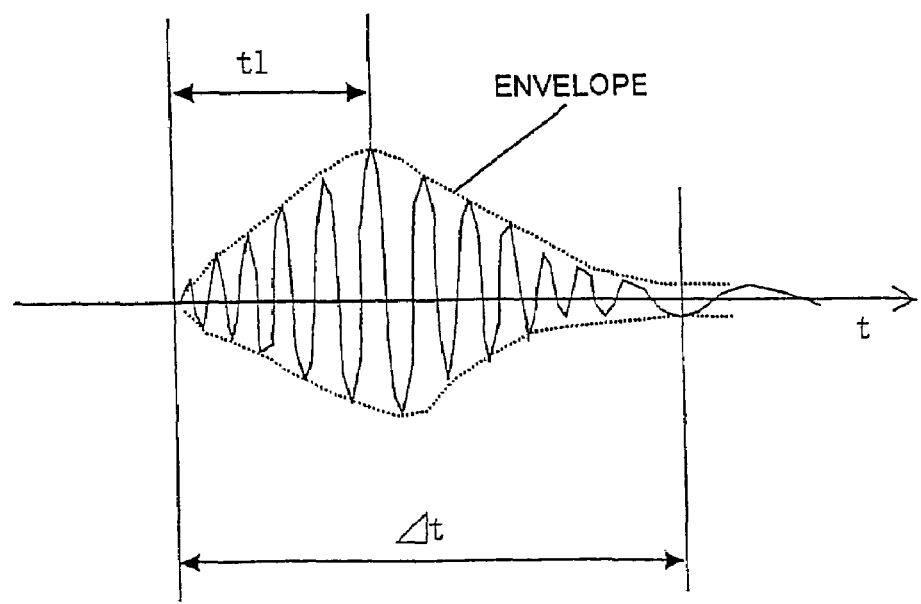
FIG. 6 is a diagram showing the envelope of a typical signal waveform.

Typically, a partial discharge signal has a single-pulse waveform as illustrated in FIG. 5 at the point of occurrence of the partial discharge. However, the partial discharge signal propagates through repetitive cycles of reflection, resonance and attenuation until the partial discharge signal reaches the partial discharge sensor 2 through the stator coils of the rotating electric machine 1, and the partial discharge signal is passed through the frequency band f1 of which bandwidth is limited to 3 MHz within the range of 5 MHz to 40 MHz. For this reason, the partial discharge signal which has passed through the bandpass filters 15a, 15b has an oscillatory signal waveform as shown in FIG. 6. Here, it is necessary to detect a maximum value of the envelope of the signal waveform of FIG. 6. While peak reaching time t1 required for the envelope of the single-pulse oscillatory signal waveform to reach the maximum value is determined by the size of the rotating electric machine 1 and the length of each stator coil thereof, for instance, the peak reaching time t1 falls within a range of approximately several hundred nanoseconds to 1 µs in the case of partial discharges occurring in the stator coils. Detection time Δt must be set to a time duration which ensures reliable detection of the maximum value of the envelope. Typically with the rotating electric machine, it is possible to peak-hold the maximum value of the envelope and detect the partial discharge magnitude by setting the detection time Δt to about 2 µs. If the detection time Δt is set to an unnecessarily long time duration, there arises a risk of detecting more than one pulse within the detection time Δt. Should this situation occur, the f1 band detecting circuit 12 and the f2 band detecting circuit 13 may detect different pulses within the detection time Δt.

The signal detection level 33 is set to 15% of the measurement range, for example. With the signal detection level 33 set to 15% of the measurement range, low-level signals are ignored and only high-level partial discharges contributable to deterioration of insulation can be efficiently detected. In the partial discharge monitoring apparatus 4 of the embodiment, the signal detection level 33 is made variable. Thus, in the case of the rotating electric machine in which a large number of low-intensity noise pulses are detected, it is possible to substantially limit the number of detected pulses by increasing the signal detection level 33.

Figure 7:
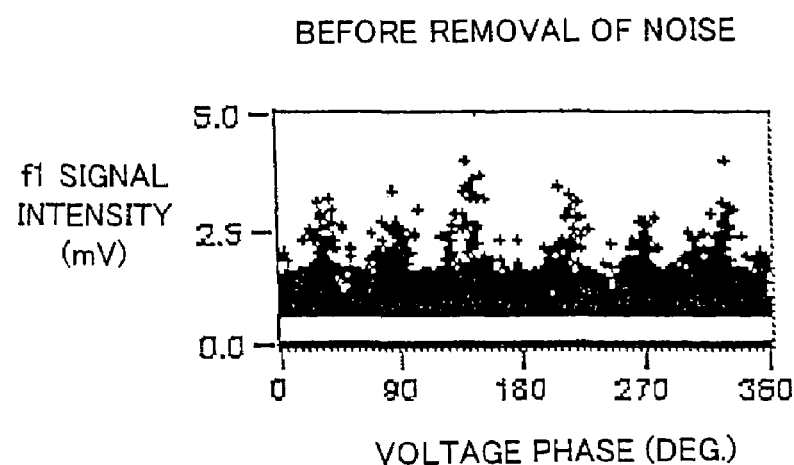
FIG. 7 is a diagram showing entire detected pulses from which noise components have not been removed according to the first embodiment.
Figure 8:
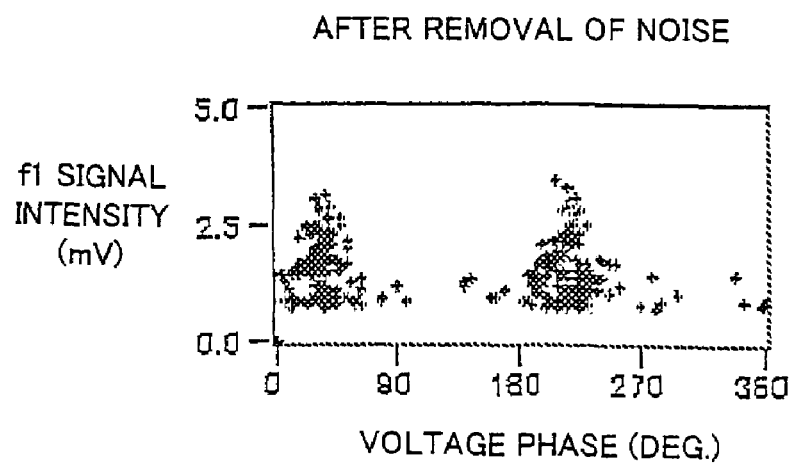
FIG. 8 is a diagram showing pulses from which noise components have been removed according to the first embodiment.

When removing noise components with the aid of the controller CPU 22, the partial discharge monitoring apparatus 4 uses the angle of a boundary line between the A signal group 30a and the B signal group 31a as a noise removing threshold 29 which is shown in the histogram of FIG. 3. In the example shown in FIG. 3, the noise removing threshold 29 is 28 degrees, so that pulses belonging to the B signal group 31a and the C signal group 32a which are located below this 28-degree noise removing threshold 29 are removed as noise components. FIGS. 7 and 8 show partial discharge occurring phase characteristics before and after removal of the noise components, i.e., the pulses of the B signal group 31a and the C signal group 32a shown in FIG. 3, respectively. More specifically, FIG. 7 shows the partial discharge occurring phase characteristic obtained from the entire detected pulses from which the noise components have not been removed, whereas FIG. 8 shows the partial discharge occurring phase characteristic obtained from the pulses belonging to the A signal group 30a alone from which the noise components have been removed.

As thus far discussed, the signal detection timing is determined in consideration of the phenomenon of the occurrence of partial discharges in the stator coils in the first embodiment, in which the detection time Δt is set to 2 μs with particular attention paid to very high frequency components of partial discharge signals and the dead time 36 is set within the range of 6 μs to 100 μs taking into account intervals of harmful partial discharges occurring in the stator coils. The present embodiment is advantageous in that the aforementioned arrangement of the embodiment makes it possible to substantially reduce the number of detected pulses and to reduce equipment size and cost while maintaining a signal discriminating function using two-frequency correlation characteristics.

Although the peak hold time 34 is set to 2 μs and the dead time 36 is set to 6 μs in the example of the first embodiment shown in FIG. 4, the invention is not limited to this example. According to the invention, the peak hold time 34 and the dead time 36 may be set within a range of 1 μs to 2 μs and within the aforementioned range of 6 μs to 100 μs, respectively. The dead time 36, which is determined in consideration of the equipment cost, should preferably be 50 μs.

Second Embodiment

Figure 9:
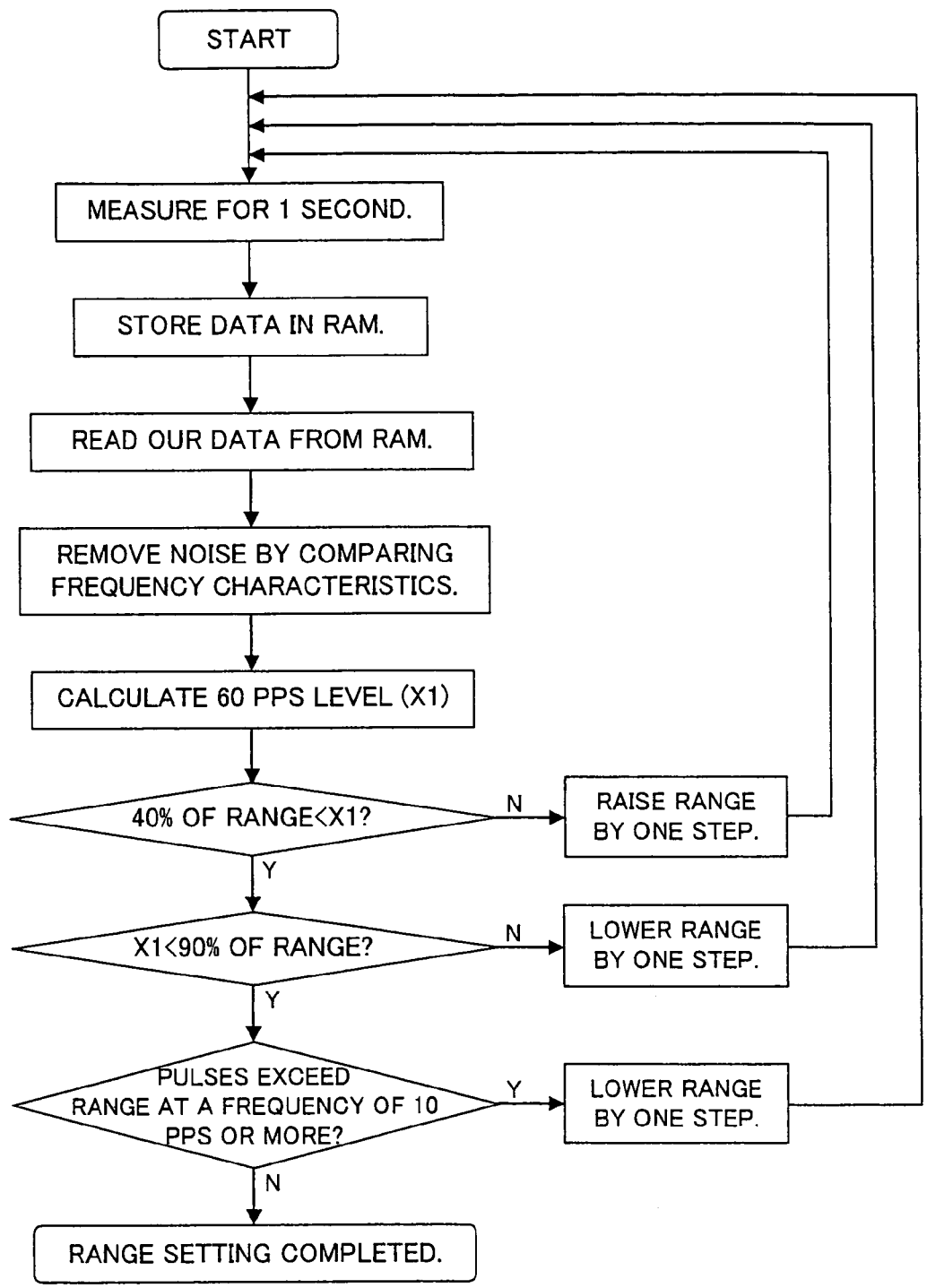
FIG. 9 is a flowchart showing an automatic measurement range setting procedure according to a second embodiment of the invention.

FIG. 9 is a flowchart showing an automatic measurement range setting procedure of a second embodiment by which the measurement range is automatically set in accordance with detected signal levels. The controller CPU 22 automatically sets the attenuator 14a for the frequency band f1 by the following operation flow.

Step 1: Signals are measured for 1 second.

Step 2: The controller CPU 22 stores measured data in the RAM 19.

Step 3: The controller CPU 22 reads out the data stored in the RAM 19.

Step 4: The controller CPU 22 removes noise by the aforementioned two-frequency correlation noise removal method of the first embodiment.

Step 5: The controller CPU 22 determines the level at which partial discharge pulses occur at a frequency of 60 pps where the commercial frequency is 60 Hz (50 pps where the commercial frequency is 50 Hz) by calculation.

Step 6: The controller CPU 22 compares the level of 60 pps with a 40% level of the current measurement range. If the 60 pps level is lower than 40% of the measurement range, the controller CPU 22 raises the sensitivity by one step and signals are measured again. If the 60 pps level is equal to or higher than 40% of the measurement range, the controller CPU 22 proceeds to the next step.

Step 7: The controller CPU 22 compares the level of 60 pps with a 90% level of the current measurement range. If the 60 pps level is equal to or higher than 90% of the measurement range, the controller CPU 22 lowers the sensitivity by one step and signals are measured again. If the 60 pps level is lower than 90% of the measurement range, the controller CPU 22 proceeds to the next step.

In steps 6 and 7 above, the controller CPU 22 controls the partial discharge monitoring apparatus 4 such that the 60 pps level lies between 40% to 90% of the measurement range.

Step 8: The controller CPU 22 counts the number of partial discharge pulses of which levels exceed the measurement range within a given period of time. If the levels of the detected pulses exceed the measurement range at a frequency of 10 pps or more, the controller CPU 22 lowers the measurement range by one step and signals are measured again. In the case of remeasurement, priority is given to a range-over comparison reference.

Step 9: When the judgment results in steps 6 and 7 above become Yes and the judgment result in step 8 becomes No, the controller CPU 22 adopts the measurement range determined as explained above, whereby the measurement range setting procedure for the frequency band f1 is completed.

The controller CPU 22 automatically sets the attenuator 14b for the frequency band f2 by the following operation flow, on the other hand.

Step 1: Signals are measured for 1 second.

Step 2: The controller CPU 22 stores measured data in the RAM 19.

Step 3: The controller CPU 22 reads out the data stored in the RAM 19.

Steps 1, 2 and 3 for the measurement of the frequency band f2 are performed at the same time with steps 1, 2 and 3 for the measurement of the frequency band f1.

Step 4: The controller CPU 22 compares the maximum value of the levels of the signals measured in the frequency band f2 with a 50% level of the current measurement range. If the maximum value of the measured signal levels is lower than 50% of the measurement range, the controller CPU 22 raises the sensitivity by one step and signals are measured again. If the maximum value of the measured signal levels is equal to or higher than 50% of the measurement range, the controller CPU 22 proceeds to the next step.

Step 5: The controller CPU 22 compares the maximum value of the levels of the signals measured in the frequency band f2 with a 95% level of the current measurement range. If the maximum value of the measured signal levels is equal to or higher than 95% of the measurement range, the controller CPU 22 lowers the sensitivity by one step and signals are measured again. If the maximum value of the measured signal levels is lower than 95% of the measurement range, the controller CPU 22 proceeds to the next step.

Step 6: When the judgment results in steps 4 and 5 above become Yes, the controller CPU 22 adopts the measurement range determined as explained above, whereby the measurement range setting procedure for the frequency band f2 is completed.

As shown in the foregoing discussion, the measurement ranges for the frequency bands f1 and f2 can be determined using the value of the 60 pps (50 pps) level obtained after removal of noise as a reference from measurement values each time the partial discharge is measured, so that incoming signals can be measured on the measurement range suited to the signal level at all times. Consequently, it is possible to remotely monitor the state of insulation with high accuracy.

In addition, since the f1 band detecting circuit 12 and the f2 band detecting circuit 13 are individually set to the optimum measurement ranges, the present embodiment is advantageous in that the aforementioned arrangement of the embodiment makes it possible to detect partial discharge pulses with high sensitivity and easily remove noise using the two-frequency correlation approach.

Furthermore, since the measurement range is set based on the value of the 60 pps level obtained after removal of noise, the present embodiment produces an advantage that partial discharges "buried" in noise can be detected with high accuracy, thereby enabling unmanned high-precision remote monitoring operation.

Third Embodiment

A third embodiment of the invention employs a configuration which makes it possible to vary the signal detection levels 33 of the peak hold circuits 17a, 17b based on partial discharge data obtained in the aforementioned measurement range setting procedure. Here, the most preferable ratio of varying the signal detection level 33 is 50% of the value of the signal detection level 33 at which partial discharges are detected at a frequency of 60 pps. If the value of the signal detection level 33 at which partial discharges are detected at a frequency of 60 pps is 70 mV when the measurement range is 0 to 100 mV, for example, the signal detection level 33 is set to 35 mV so that pulses lower than 35 mV would not be peak-held. In a case where partial discharges occur intermittently and the levels of the detected pulses exceed the measurement range at a frequency of 10 pps, the controller CPU 22 alters the value of the signal detection level 33 (which is 40 mV in this case) for detecting the pulses at the frequency of 60 pps to 20 mV so that pulses lower than 20 mV would not be peak-held.

In many cases, noise pulses detected in the frequency bands f1 and f2 have lower signal levels than partial discharges and occur more frequently than the partial discharges. Accordingly, the controller CPU 22 automatically controls the signal detection level 33 based on the levels of the partial discharges so that low-level noise pulses would not be detected when high-level partial discharges occur.

Generally, low-level noise pulses occur in large numbers. If the partial discharge monitoring apparatus 4 detects pulse signals including such noise pulses, there arises a problem that a substantial time would be needed for processing and transferring detected data for the execution of the remote monitoring operation. It is possible to shorten the overall processing time while accomplishing the purpose of the remote monitoring operation by detecting pulse signals with greater emphasis placed on high-level partial discharges which could produce a harmful effect contributable to deterioration of insulation.

In this embodiment, the signal detection level 33 is made variable to ½ of the ordinary partial discharge magnitude. This arrangement of the present embodiment makes it possible to substantially reduce the number of detected pulses. If the partial discharge monitoring apparatus 4 of this embodiment is employed in a partial discharge remote monitoring system, the partial discharge monitoring apparatus 4 produces an effect that the data processing time and data transfer time are significantly reduced. Furthermore, the present embodiment is advantageous in that the aforementioned arrangement of the embodiment makes it possible to substantially reduce the size and cost of the partial discharge monitoring apparatus 4.

When both partial discharges and noise occur, the partial discharge sensors 2 detect partial discharges and noise pulses in a mixed fashion. In this situation, the peak hold circuit 17a (17b) could be triggered by a low-level noise pulse and may fail to detect a partial discharge occurring during the dead time 36 immediately following the triggering by the low-level noise pulse. The arrangement of the embodiment serves to solve this problem as well.

Fourth Embodiment

Now, the working of the partial discharge remote monitoring system 100 which transfers data obtained by the partial discharge monitoring apparatus 4 to the monitoring server 8 is described.

Although not illustrated, the partial discharge monitoring apparatus 4 includes a comparator which compares data on the signal detected by the arrangement of the foregoing first to third embodiments with a preset reference value. If a partial discharge which has occurred in the rotating electric machine 1 exceeds a predefined permissible level, the data is immediately transmitted to the monitoring server 8 installed in the supervisory control center 7 via a communications network including the Internet 6. When the partial discharge exceeding the permissible level has occurred, relevant information can be instantly transmitted to the supervisory control center 7 in this fourth embodiment. This arrangement of the embodiment makes it possible to take necessary action as soon as possible in case of need, thereby enabling unmanned remote monitoring operation.

Under normal operating conditions in which partial discharges do not exceed the permissible level, all detected signal data are stored in the partial discharge monitoring apparatus 4 for a predetermined period of time, such as one day or one week. The partial discharge monitoring apparatus 4 transmits all of the stored signal data to the monitoring server 8 each time the end of the predetermined period of time is reached. This approach of the embodiment is advantageous in that transmission of information can be simplified and communication cost needed for transmission of the information can be reduced.

According to the present embodiment, the partial discharge monitoring apparatus 4 stores the signal data for the predetermined period of time and the comparator produces data on the magnitude of partial discharges and on a trend of partial discharge occurrences and transmits the data thus produced to the monitoring server 8. It is therefore possible to easily recognize the trend of partial discharge occurrences during the predetermined period of time. This also serves to reduce the communication cost.

While the partial discharge monitoring apparatus 4 connected to the rotating electric machine 1 is linked to the supervisory control center 7 located at a single site in the example shown in the foregoing first to fourth embodiments, the invention is not limited to this configuration. The invention is also applicable to a configuration in which the supervisory control center 7 located at a single site performs centralized supervisory control of a plurality of partial discharge monitoring apparatuses individually connected to rotating electric machines which are located at different sites.

It is appreciated from the foregoing discussion that the partial discharge monitoring apparatus 4 and the partial discharge remote monitoring system 100 according to the aforementioned first to fourth embodiments of the invention enable unmanned high-precision remote monitoring of partial discharges occurring through coil insulators used in turbine generators installed at a gas power plant or at other type of thermal power plant and in other high-voltage rotating electric machines installed at various facility sites.

What is claimed is:

1. A partial discharge monitoring apparatus for a rotating electric machine, said partial discharge monitoring apparatus comprising:
    a partial discharge detecting circuit including first and second frequency band detecting circuits which include first and second attenuators, first and second bandpass filters, and first and second peak hold circuits, respectively; and
    a controller CPU, wherein
        the first and second frequency band detecting circuits simultaneously measure each signal output from a partial discharge sensor located in the rotating electric machine,
        the controller CPU controls measurement ranges of the first and second frequency band detecting circuits by controlling the first and second attenuators,
        the first and second bandpass filters allow signals which have passed through the first and second attenuators to pass if the signals fall within first and second frequency bands, respectively, the second frequency band of the second bandpass filter being higher than the first frequency band of the first bandpass filter, the first and second peak hold circuits detect a peak value of an input signal when the input signal, among the signals which have passed through the first and second bandpass filters, exceeds a signal detection level, the second peak hold circuit operating only when the first peak hold circuit has operated, detection time for detecting the signal input into each of the first and second peak hold circuits includes a peak hold time, a reset time, and a dead time, wherein the peak hold time is within a range of 1 µs to 2 µs, the dead time is within a range of 6 µs to 100 µs, and the peak hold time is variable, and a next-occurring signal is detected after the dead time has elapsed.

2. The partial discharge monitoring apparatus for a rotating electric machine according to claim 1, wherein the first and second frequency bands are within a range of 5 MHz to 40 MHz, the first frequency band has a bandwidth between 1 MHz and 3 MHz, and the second frequency band is at least 5 MHz higher than the first frequency band.

3. The partial discharge monitoring apparatus for a rotating electric machine according to claim 1, wherein the signal detection level of each of the first and second peak hold circuits is variable with respect to the measurement range.

4. The partial discharge monitoring apparatus for a rotating electric machine according to claim 1, wherein the signal detection level of each of the first and second peak hold circuits is 15% of the measurement range.

5. The partial discharge monitoring apparatus for a rotating electric machine according to claim 1, wherein the controller CPU removes a noise signal from a point of detection of the signal and sets the measurement ranges of the first and second frequency band detecting circuits by controlling the first and second attenuators based on data values obtained in removing the noise signal.

6. The partial discharge monitoring apparatus for a rotating electric machine according to claim 1, wherein the controller CPU controls the first and second peak hold circuits such that the signal detection level of each of the first and second peak hold circuits varies with partial discharge magnitude.

7. The partial discharge monitoring apparatus for a rotating electric machine according to claim 6, wherein the signal detection level of each of the first and second peak hold circuits is equal to ½ of the partial discharge magnitude.

8. A partial discharge remote monitoring system for a rotating electric machine, said partial discharge remote monitoring system comprising:

a partial discharge sensor located in the rotating electric machine;

a partial discharge monitoring apparatus; and a supervisory control center connected to the partial discharge monitoring apparatus via a communications network, wherein the partial discharge monitoring apparatus comprises:

a partial discharge detecting circuit including a comparator and first and second frequency band detecting circuits which include first and second attenuators, first and second bandpass filters, and first and second peak hold circuits, respectively; and a controller CPU, wherein the first and second frequency band detecting circuits simultaneously measure each signal output from the partial discharge sensor located in the rotating electric machine, the controller CPU controls measurement ranges of the first and second frequency band detecting circuits by controlling the first and second attenuators, the first and second bandpass filters allow signals which have passed through the first and second attenuators to pass if the signals fall within first and second frequency bands, respectively, the second frequency band of the second bandpass filter being higher than the first frequency band of the first bandpass filter, the first and second peak hold circuits detect a peak value of an input signal when the input signal, among the signals which have passed through the first and second bandpass filters, exceeds a signal detection level, the second peak hold circuit operating only when the first peak hold circuit has operated, detection time for detecting the signal input into each of the first and second peak hold circuits includes a peak hold time, a reset time, and a dead time, wherein the peak hold time is within a range of 1 µs to 2 µs, the dead time is within a range of 6 µs to 100 µs, and the peak hold time is variable, a next-occurring signal is detected after the dead time has elapsed, and the comparator compares signal data on the signal detected with a preset reference value and immediately transmits the signal data to the supervisory control center if a partial discharge which has occurred in the rotating electric machine exceeds a permissible level.

9. The partial discharge remote monitoring system for a rotating electric machine according to claim 8, wherein signal data on the signals detected are stored in the partial discharge monitoring apparatus for a predetermined period of time, and the partial discharge monitoring apparatus transmits all of the signal data stored to the supervisory control center at the end of the predetermined period of time.

10. The partial discharge remote monitoring system for a rotating electric machine according to claim 8, wherein signal data on the signals detected are stored in the partial discharge monitoring apparatus for a predetermined period of time, and the comparator produces partial discharge data on magnitudes of partial discharges and on trend of partial discharge occurrences and transmits the partial discharge data thus produced to the supervisory control center.

11. The partial discharge remote monitoring system for a rotating electric machine according to claim 8, wherein the first and second frequency bands are within a range of 5 MHz to 40 MHz, the first frequency band has a bandwidth between 1 MHz and 3 MHz, and the second frequency band is at least 5 MHz higher than the first frequency band.

12. The partial discharge remote monitoring system for a rotating electric machine according to claim 8, wherein the signal detection level of each of the first and second peak hold circuits is variable with respect to the measurement range.

13. The partial discharge remote monitoring system for a rotating electric machine according to claim 8, wherein the signal detection level of each of the first and second peak hold circuits is 15% of the measurement range.

* * * * *